(12) United States Patent
Fujino

(10) Patent No.: US 6,781,108 B2
(45) Date of Patent: Aug. 24, 2004

(54) NOISE CANCELING PHOTOSENSOR-AMPLIFIER DEVICE

(75) Inventor: Junji Fujino, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 0 days.

(21) Appl. No.: 09/783,007

(22) Filed: Feb. 15, 2001

(65) Prior Publication Data

US 2001/0013573 A1 Aug. 16, 2001

(30) Foreign Application Priority Data

Feb. 16, 2000 (JP) ........................................ 2000-043555

(51) Int. Cl.[7] .............................................. H01J 40/14
(52) U.S. Cl. .................................. 250/214 A; 330/308
(58) Field of Search .......................... 250/214 A, 208.1; 330/308; 438/83

(56) References Cited

U.S. PATENT DOCUMENTS

| | | | |
|---|---|---|---|
| 4,626,678 A | * | 12/1986 | Morita et al. ............ 250/214 A |
| 4,629,882 A | * | 12/1986 | Matsuda et al. ......... 250/214 R |
| 4,891,519 A | * | 1/1990 | Nohira et al. ............... 250/349 |
| 5,132,532 A | * | 7/1992 | Watanabe ................... 174/52.4 |
| 5,610,395 A | * | 3/1997 | Nishiyama ............... 250/214 A |
| 5,652,425 A | * | 7/1997 | Sawada et al. .......... 250/214 A |
| 5,724,967 A | * | 3/1998 | Venkatachalam ............ 128/902 |
| 5,781,233 A | * | 7/1998 | Liang et al. ................. 257/233 |
| 6,175,438 B1 | * | 1/2001 | Agarwal et al. ......... 250/214 A |

* cited by examiner

Primary Examiner—Thanh X. Luu
Assistant Examiner—Stephen Yam
(74) Attorney, Agent, or Firm—Arent Fox, PLLC

(57) ABSTRACT

A photosensor-amplifier device has a photoelectric conversion circuit that converts an optical signal into an electric signal, a first electrode by way of which the electric signal is extracted from the photoelectric conversion circuit, a second electrode that is not directly connected to the electric signal, an amplifier circuit that has a first input terminal and a second input terminal and that amplifies and then outputs the difference between the electric signals fed to the first and second input terminals, a first wire that connects the first electrode to the first input terminal, and a second wire that connects the second electrode to the second input terminal. This structure prevents noise signals from being induced in a signal path, such as a wire, connecting the photoelectric conversion circuit to the amplifier circuit, and thereby prevents malfunctioning of the device as experienced in conventional photosensor-amplifier devices.

6 Claims, 4 Drawing Sheets

NOISE CANCELING PHOTOSENSOR-AMPLIFIER DEVICE

BACKGROUND OF THE INVENTION

1. Field of the Invention

The present invention relates to a photosensor-amplifier device that converts an optical signal incident thereon into an electric signal and that then amplifies the electric signal for output.

2. Description of the Prior Art

First, a conventional photosensor-amplifier device will be described with reference to FIGS. 4A and 4B. FIG. 4A is a schematic sectional view showing the structure of a principal portion of a conventional photosensor-amplifier device, and FIG. 4B is an equivalent circuit diagram of the photosensor-amplifier device shown in FIG. 4A. A common photosensor-amplifier device as shown in these figures is composed of a photodiode chip 100 functioning as a photoelectric conversion element and an IC chip 200 incorporating an amplifier circuit and other components, with the photodiode chip 100 and the IC chip 200 sealed in a single package.

The photodiode chip 100 has an N-type semiconductor substrate 101 and a P-type semiconductor region 102 formed in a top portion of the substrate 101, the PN junction in between constituting a photodiode PD. The top surface of the photodiode chip 100 is coated with an insulating film 103, of which a small portion above the P-type semiconductor region 102 is removed. In this portion where the P-type semiconductor region 102 is exposed, the anode electrode 104 of the photodiode PD is provided. On the other hand, the bottom surface of the substrate 101 is die-bonded to a frame 50, and a supply voltage $V_{DD}$ is applied to the frame 50 from outside. That is, the frame 50 serves as the cathode electrode of the photodiode PD.

The anode electrode 104 of the photodiode PD is electrically connected by way of a wire W to an electrode 201 of the IC chip 200. As shown in FIG. 4B, the IC chip 200 incorporates an amplifier circuit AMP and a resistor R, and the electrode 201 is connected to the input terminal of the amplifier circuit AMP and also through the resistor R to ground.

In this photosensor-amplifier device built as described above, an optical signal incident on the photodiode chip 100 is sensed by the photodiode PD and is detected as a current signal that flows through the photodiode PD. The current signal thus obtained as a result of photoelectric conversion performed in the photodiode chip 100 is then fed by way of the wire W to the IC chip 200, where the current signal is converted into a voltage signal by the resistor R. This voltage signal is then amplified to a predetermined voltage level by the amplifier circuit AMP, and is then fed to a signal processing circuit (not shown) provided in the succeeding stage.

In this conventional photosensor-amplifier device built as described above, the path connecting the photodiode chip 100 to the IC chip 200 (i.e., the wire W and other wiring elements) has a high impedance, and therefore electromagnetic noise coming from outside the device or electromagnetic noise generated inside the device tends to cause electromagnetic induction whereby noise signals tend to be induced in the wire W and other components. Moreover, the path connecting the photodiode chip 100 to the IC chip 200 is susceptible also to noise signals induced by the coupling capacitance that accompanies the path.

Despite these facts, the conventional photosensor-amplifier device is provided with no means of reducing such noise signals, and therefore noise signals are amplified, unchecked, by the amplifier circuit AMP and tend to cause malfunctioning of the IC chip 200. To solve this problem, some measure against electromagnetic noise, such as an electromagnetic shield, is essential, which inconveniently increases the total number of components, and thus the cost, of the photosensor-amplifier device.

Moreover, as shown in FIG. 4A, in the photosensor-amplifier device built as described above, the anode electrode 104 of the photodiode PD is connected to the electrode 201 of the IC chip 200 by way of a single wire W. Thus, the wire W is, at both ends, die-bonded directly to the anode electrode 104 and to the electrode 201, respectively.

In the wire-bonding process of this wire W, first, one end of the wire W is bonded to one of the anode electrode 104 and the electrode 201 (this operation is called the first bonding), and then the other end of the wire W is bonded to the other of those electrodes (this operation is called the second bonding). Here, on the chip where the wire W was bonded as the second bonding, it is subsequently necessary to cut the wire W. Inconveniently, the mechanical force accompanying the wire cutting here is applied to the chip and may cause chip breakage.

SUMMARY OF THE INVENTION

An object of the present invention is to provide a photosensor-amplifier device that, despite having a photoelectric conversion circuit and an amplifier circuit connected together by way of a wire, is less likely than ever to malfunction under the influence of noise signals induced in the wire and other components.

Another object of the present invention is to provide a photosensor-amplifier device that is less likely than ever to suffer chip breakage in a wire-bonding process.

To achieve the above object, according to the present invention, a photosensor-amplifier device has a photoelectric conversion circuit that converts an optical signal into an electric signal, a first electrode by way of which the electric signal is extracted from the photoelectric conversion circuit, a second electrode that is not directly connected to the electric signal, an amplifier circuit that has a first input terminal and a second input terminal and that amplifies and then outputs the difference between the electric signals fed to the first and second input terminals, a first wire that connects the first electrode to the first input terminal, and a second wire that connects the second electrode to the second input terminal.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

First Embodiment

Figure 1A:
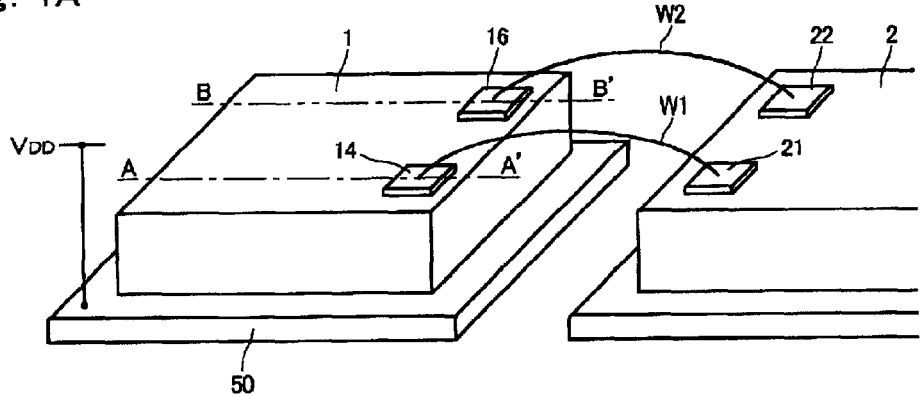
FIG. 1A is a schematic perspective view showing the structure of a principal portion of the photosensor-amplifier device of a first embodiment of the invention.
Figure 1B:
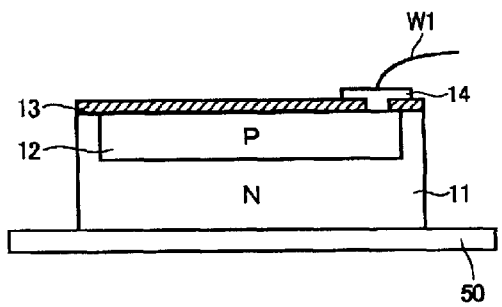
FIG. 1B is a schematic sectional view of the photodiode chip 1 shown in FIG. 1A, taken along line A–A'.
Figure 1C:
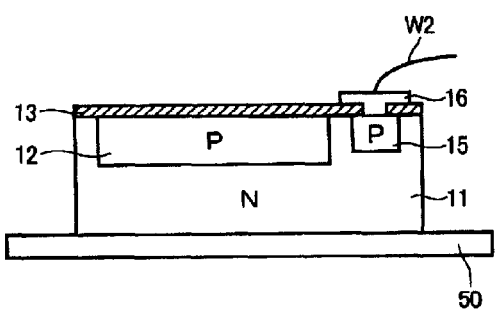
FIG. 1C is a schematic sectional view of the photodiode chip 1 shown in FIG. 1A, taken along line B–B'.
Figure 1D:
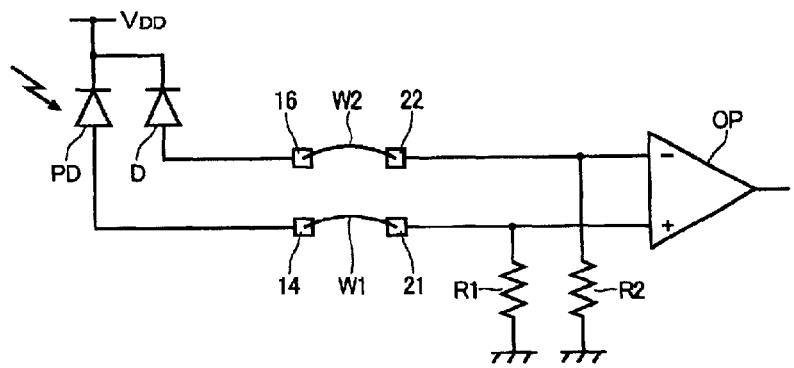
FIG. 1D is an equivalent circuit diagram of the photosensor-amplifier device shown in FIG. 1A.

The photosensor-amplifier device of a first embodiment of the invention will be described below with reference to FIGS. 1A to 1D. FIG. 1A is a schematic perspective view showing the structure of a principal portion of the photosensor-amplifier device of the first embodiment. FIG. 1B is a schematic sectional view of the photodiode chip 1 shown in FIG. 1A, taken along line A–A'. FIG. 1C is a schematic sectional view of the photodiode chip 1 shown in FIG. 1A, taken along line B–B'. FIG. 1D is an equivalent circuit diagram of the photosensor-amplifier device shown in FIG. 1A. The photosensor-amplifier device of this embodiment shown in these figures is composed of a photodiode chip 1 functioning as a photoelectric conversion element and an IC chip 2 incorporating an amplifier circuit and other components, with the photodiode chip 1 and the IC chip 2 sealed in a single package.

The photodiode chip 1 has an N-type semiconductor substrate 11 and a first P-type semiconductor region 12 (hereinafter called the first region) formed in a top portion of the substrate 11, the PN junction between the substrate 11 and the first region 12 constituting a photodiode PD. Also formed in the top portion of the substrate 11 is a second P-type semiconductor region 15 (hereinafter called the second region) that is sufficiently smaller than the first region 12, the PN junction between the substrate 11 and the second region 15 constituting a photodiode. This photodiode has its top surface shielded from light by an electrode 16 so as not to produce a signal due to light. This photodiode will hereinafter be called the dummy diode D.

The top surface of the photodiode chip 1 is coated with an insulating film 13, of which a small portion above the first region 12 and a small portion above the second region 15 are removed. In these portions where the first and second regions 12 and 15 are exposed, the anode electrode 14 of the photodiode PD and the anode electrode 16 (hereinafter called the dummy electrode) of the dummy diode D, respectively, are provided. On the other hand, the bottom surface of the substrate 11 is die-bonded to a frame 50, and a supply voltage $V_{DD}$ is applied to the frame 50 from outside. That is, the frame 50 serves as the cathode electrode common to the photodiode PD and the dummy diode D.

The anode electrode 14 of the photodiode PD is electrically connected by way of a first wire W1 to a first electrode 21 of the IC chip 2, and the dummy electrode 16 of the dummy diode D is electrically connected by way of a second wire W2 to a second electrode 22 of the IC chip 2. As shown in FIG. 1D, the IC chip 2 incorporates an operational amplifier circuit OP and resistors R1 and R2; the first electrode 21 is connected to the non-inverting input terminal (+) of the operational amplifier circuit OP and also through the resistor R1 to ground, and the second electrode 22 is connected to the inverting input terminal (−) of the operational amplifier circuit OP and also through the resistor R2 to ground.

In this photosensor-amplifier device built as described above, an optical signal incident on the photodiode chip 1 is sensed by the photodiode PD and is detected as a current signal that flows through the photodiode PD. The current signal thus obtained as a result of photoelectric conversion performed in the photodiode chip 1 is then fed by way of the first wire W1 to the IC chip 2, where the current signal is converted into a voltage signal by the resistor R1. This voltage signal is then fed to the non-inverting input terminal (+) of the operational amplifier circuit OP.

On the other hand, a voltage at the second electrode 22 is fed to the inverting input terminal (−) of the operational amplifier circuit OP. Thus, the operational amplifier circuit OP amplifies to a predetermined voltage level the differential signal between the voltage signal fed to its non-inverting input terminal (+) and the voltage fed from the second electrode 22 to its inverting input terminal (−), and then feeds the amplified differential signal to a signal processing circuit (not shown) or the like provided in the succeeding stage.

As described previously, the second electrode 22 of the IC chip 2 is connected by way of the second wire W2 to the dummy electrode 16 of the photodiode chip 1. This dummy electrode 16 is electrically open (more precisely, it is not directly connected to the current signal obtained as a result of photoelectric conversion performed in the photodiode chip 1).

Therefore, unless a noise signal is induced in the second wire W2 and other components by electromagnetic noise coming from outside the device, electromagnetic noise generated inside the device, or the like, the voltage at the second electrode 22 is normally kept at the ground level. In this case, the voltage signal fed to the non-inverting input terminal (+) of the operational amplifier circuit OP is, as it is, amplified to the predetermined voltage level, and is then fed to the signal processing circuit (not shown) or the like provided in the succeeding stage.

By contrast, when a noise signal is induced in the first wire W1 by electromagnetic noise coming from outside the device, electromagnetic noise generated inside the device, or the like, a noise signal similar to this noise signal is induced also in the second wire W2, and therefore a voltage corresponding to the noise signal appears at the second terminal 22. In this case, the differential signal between the voltage signal fed to the non-inverting input terminal (+) of the operational amplifier circuit OP and the voltage fed from the second electrode 22 to the inverting input terminal (−) thereof is amplified to the predetermined voltage level, and is then fed to the signal processing circuit (not shown) or the like provided in the succeeding stage. Thus, by the operational amplifier circuit OP, the noise signal induced in the first wire W1 is canceled with the noise signal induced in the second wire W2. Moreover, by the operational amplifier circuit OP, the dark current that flows through the photodiode PD when no light is incident on the photodiode chip 100 is canceled with the dark current that flows through the dummy diode D.

In this structure, even if a noise signal is induced in the first wire W1 and other components by way of which the current signal obtained as a result of photoelectric conversion performed in the photodiode chip 1 is transmitted to the IC chip 2, the noise signal is never amplified unchecked. This helps reduce the risk of malfunctioning of the IC chip 2.

With the structure as described above, which itself helps reduce such noise signals, it is possible to simplify the noise prevention measures, such as an electromagnetic shield, that need to be additionally provided, and, in some cases, it is possible even to eliminate the need for such additional noise prevention measures. This makes it possible to reduce the number of components, and thus the cost, of the photosensor-amplifier device.

In the photosensor-amplifier device built as described above, it is preferable that the lengths of the first and second wires W1 and W2 be made as nearly equal as possible, and that the two wires W1 and W2 be laid as parallel and close to each other as possible. Specifically, for example, the distance between the anode electrode 14 of the photodiode chip 1 and the first electrode 21 of the IC chip 2 and the distance between the dummy electrode 16 of the photodiode chip 1 and the second electrode 22 of the IC chip 2 are made as nearly equal to each other as possible. Moreover, the distance between the anode electrode 14 of the photodiode chip 1 and the dummy electrode 16 and the distance between the first and second electrodes 21 and 22 of the IC chip 2 are made as short as possible and as nearly equal to each other as possible.

This structure permits the first and second wires W1 and W2 to receive electromagnetic noise to more nearly equal degrees, and thus makes the noise signals induced in those wires more nearly equal to each other. As a result, the noise signals cancel each other more fully in the operational amplifier circuit OP, and thus the noise signal induced in the first wire W1 can be reduced more effectively.

In the first embodiment described above, the substrate 11 of the photodiode chip 1 is made of an N-type semiconductor. However, the structure of this embodiment is applicable also in cases where the substrate 11 is made of a P-type semiconductor.

Second Embodiment

Figure 2A:
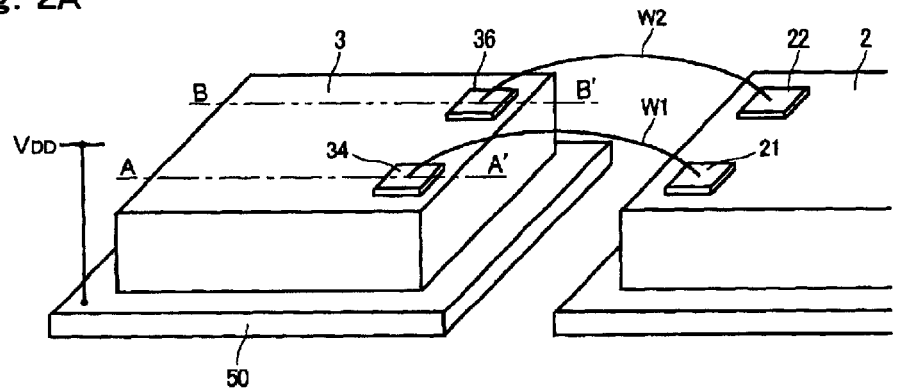
FIG. 2A is a schematic perspective view showing the structure of a principal portion of the photosensor-amplifier device of a second embodiment of the invention.
Figure 2B:
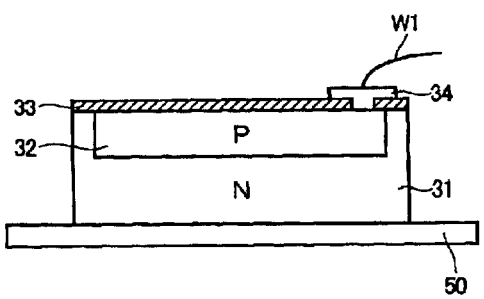
FIG. 2B is a schematic sectional view of the photodiode chip 3 shown in FIG. 2A, taken along line A–A'.
Figure 2C:
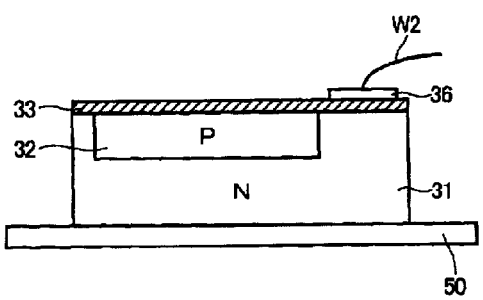
FIG. 2C is a schematic sectional view of the photodiode chip 3 shown in FIG. 2A, taken along line B–B'.
Figure 2D:
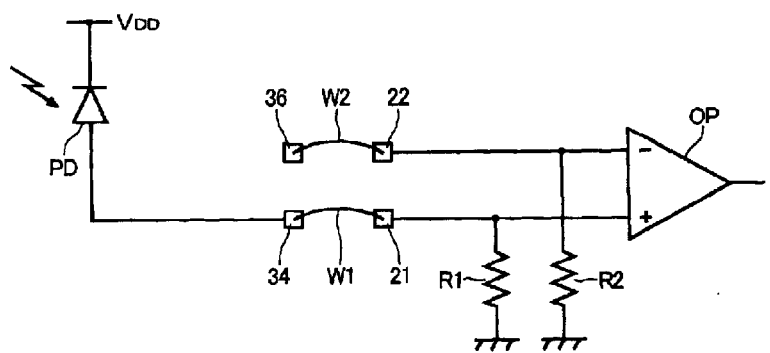
FIG. 2D is an equivalent circuit diagram of the photosensor-amplifier device shown in FIG. 2A.

The photosensor-amplifier device of a second embodiment of the invention will be described below with reference to FIGS. 2A to 2D. FIG. 2A is a schematic perspective view showing the structure of a principal portion of the photosensor-amplifier device of the second embodiment. FIG. 2B is a schematic sectional view of the photodiode chip 3 shown in FIG. 2A, taken along line A–A'. FIG. 2C is a schematic sectional view of the photodiode chip 3 shown in FIG. 2A, taken along line B–B'. FIG. 2D is an equivalent circuit diagram of the photosensor-amplifier device shown in FIG. 2A. The photosensor-amplifier device of this embodiment shown in these figures is composed of a photodiode chip 3 functioning as a photoelectric conversion element and an IC chip 2 incorporating an amplifier circuit and other components, with the photodiode chip 3 and the IC chip 2 sealed in a single package.

The photodiode chip 3 has an N-type semiconductor substrate 31 and a P-type semiconductor region 32 formed in a top portion of the substrate 31, the PN junction in between constituting a photodiode PD. The top surface of the photodiode chip 3 is coated with an insulating film 33, of which a small portion above the P-type semiconductor region 32 is removed. In this portion where the P-type semiconductor region 32 is exposed, the anode electrode 34 of the photodiode PD is provided. Moreover, on top of the insulating film 33, a dummy electrode 36 is provided. On the other hand, the bottom surface of the substrate 31 is die-bonded to a frame 50, and a supply voltage $V_{DD}$ is applied to the frame 50 from outside. That is, the frame 50 serves as the cathode electrode of the photodiode PD.

The anode electrode 34 of the photodiode PD is electrically connected by way of a first wire W1 to a first electrode 21 of the IC chip 2, and the dummy electrode 36 is electrically connected by way of a second wire W2 to a second electrode 22 of the IC chip 2. As shown in FIG. 2D, the IC chip 2 incorporates an operational amplifier circuit OP and resistors R1 and R2; the first electrode 21 is connected to the non-inverting input terminal (+) of the operational amplifier circuit OP and also through the resistor R1 to ground, and the second electrode 22 is connected to the inverting input terminal (−) of the operational amplifier circuit OP and also through the resistor R2 to ground.

In this photosensor-amplifier device built as described above, an optical signal incident on the photodiode chip 3 is sensed by the photodiode PD and is detected as a current signal that flows through the photodiode PD. The current signal thus obtained as a result of photoelectric conversion performed in the photodiode chip 3 is then fed by way of the first wire W1 to the IC chip 2, where the current signal is converted into a voltage signal by the resistor R1. This voltage signal is then fed to the non-inverting input terminal (+) of the operational amplifier circuit OP.

On the other hand, a voltage at the second electrode 22 is fed to the inverting input terminal (−) of the operational amplifier circuit OP. Thus, the operational amplifier circuit OP amplifies to a predetermined voltage level the differential signal between the voltage signal fed to its non-inverting input terminal (+) and the voltage fed from the second electrode 22 to its inverting input terminal (−), and then feeds the amplified differential signal to a signal processing circuit (not shown) or the like provided in the succeeding stage.

As described previously, the second electrode 22 of the IC chip 2 is connected by way of the second wire W2 to the dummy electrode 36 of the photodiode chip 3. This dummy electrode 36 is electrically open (more precisely, it is not directly connected to the current signal obtained as a result of photoelectric conversion performed in the photodiode chip 3).

Therefore, unless a noise signal is induced in the second wire W2 and other components by electromagnetic noise coming from outside the device, electromagnetic noise generated inside the device, or the like, the voltage at the second electrode 22 is normally kept at the ground level. In this case, the voltage signal fed to the non-inverting input terminal (+) of the operational amplifier circuit OP is, as it is, amplified to the predetermined voltage level, and is then fed to the signal processing circuit (not shown) or the like provided in the succeeding stage.

By contrast, when a noise signal is induced in the first wire W1 by electromagnetic noise coming from outside the device, electromagnetic noise generated inside the device, or the like, a noise signal similar to this noise signal is induced also in the second wire W2, and therefore a voltage corresponding to the noise signal appears at the second terminal 22. In this case, the differential signal between the voltage signal fed to the non-inverting input terminal (+) of the operational amplifier circuit OP and the voltage fed from the second electrode 22 to the inverting input terminal (−) thereof is amplified to the predetermined voltage level, and is then fed to the signal processing circuit (not shown) or the like provided in the succeeding stage. Thus, by the operational amplifier circuit OP, the noise signal induced in the first wire W1 is canceled with the noise signal induced in the second wire W2.

In this structure, even if a noise signal is induced in the first wire W1 and other components by way of which the current signal obtained as a result of photoelectric conversion performed in the photodiode chip 3 is transmitted to the IC chip 2, the noise signal is never amplified unchecked. This helps reduce the risk of malfunctioning of the IC chip 2.

With the structure as described above, which itself helps reduce such noise signals, it is possible to simplify the noise prevention measures, such as an electromagnetic shield, that need to be additionally provided, and, in some cases, it is possible even to eliminate the need for such additional noise prevention measures. This makes it possible to reduce the number of components, and thus the cost, of the photosensor-amplifier device.

In the photosensor-amplifier device built as described above, it is preferable that the lengths of the first and second wires W1 and W2 be made as nearly equal as possible, and that the two wires W1 and W2 be laid as parallel and close to each other as possible. Specifically, for example, the distance between the anode electrode 34 of the photodiode chip 3 and the first electrode 21 of the IC chip 2 and the distance between the dummy electrode 36 of the photodiode chip 3 and the second electrode 22 of the IC chip 2 are made as nearly equal to each other as possible. Moreover, the distance between the anode electrode 34 of the photodiode chip 3 and the dummy electrode 36 and the distance between the first and second electrodes 21 and 22 of the IC chip 2 are made as short as possible and as nearly equal to each other as possible.

This structure permits the first and second wires W1 and W2 to receive electromagnetic noise to more nearly equal degrees, and thus makes the noise signals induced in those wires more nearly equal to each other. As a result, the noise signals cancel each other more fully in the operational amplifier circuit OP, and thus the noise signal induced in the first wire W1 can be reduced more effectively.

In the photosensor-amplifier device of the second embodiment described above, the substrate 31 of the photodiode chip 3 is made of an N-type semiconductor. However, the structure of this embodiment is applicable also in cases where the substrate 31 is made of a P-type semiconductor.

Third Embodiment

Figure 3:
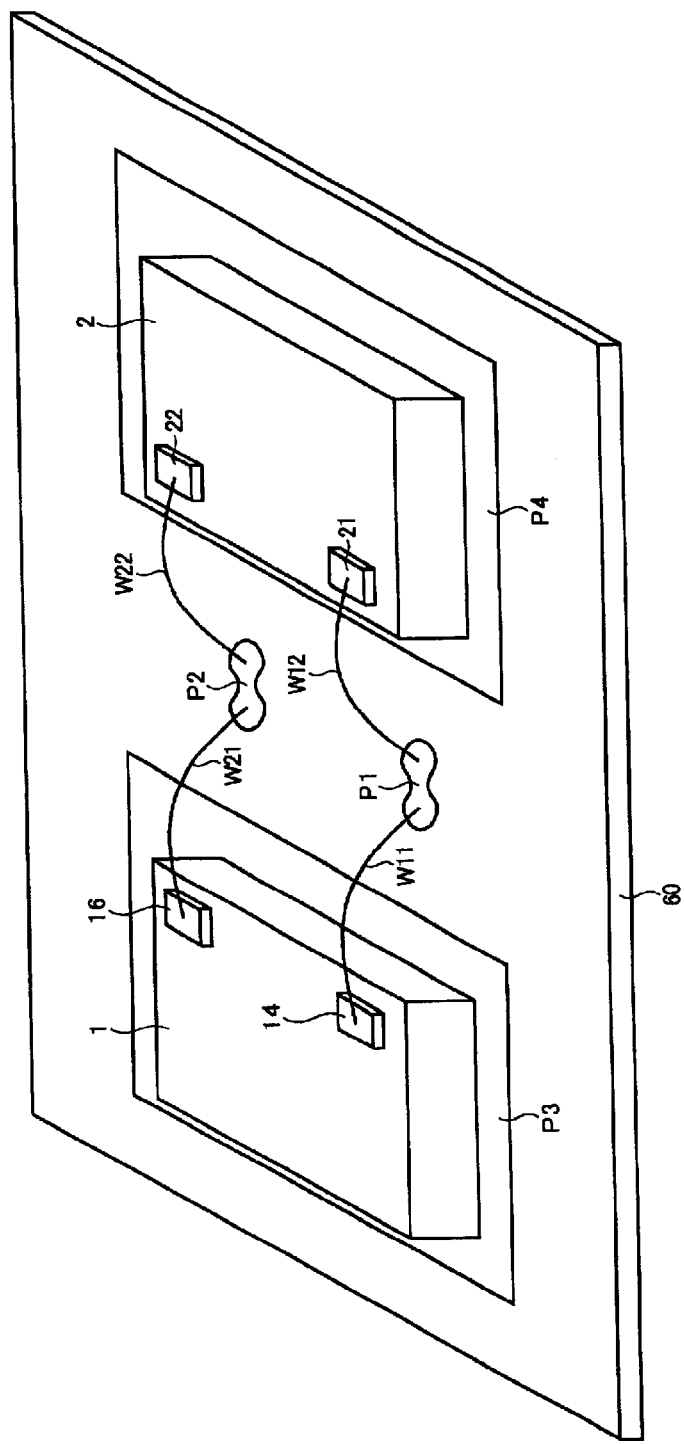
FIG. 3 is a schematic perspective view showing the structure of a principal portion of the photosensor-amplifier device of a third embodiment of the invention.
Figure 4A:
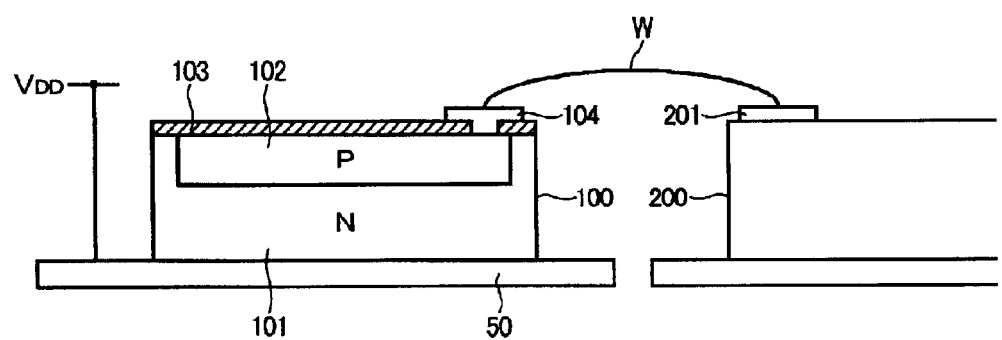
FIG. 4A is a schematic perspective view showing the structure of a principal portion of a conventional photosensor-amplifier device.
Figure 4B:
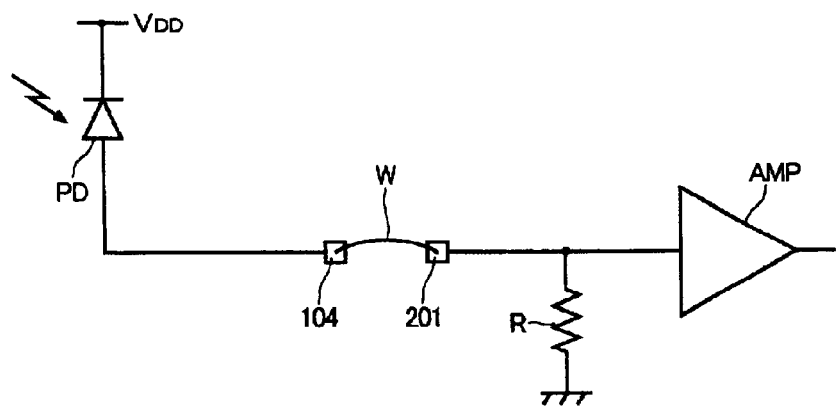
FIG. 4B is an equivalent circuit diagram of the conventional photosensor-amplifier device shown in FIG. 4A.

The photosensor-amplifier device of a third embodiment of the invention will be described below with reference to FIG. 3. FIG. 3 is a schematic perspective view showing the structure of a principal portion of the photosensor-amplifier device of the third embodiment. The photosensor-amplifier device of this embodiment has basically the same structure as the photosensor-amplifier device of the first or second embodiment described previously, but is so improved as to be less likely to suffer chip breakage in the wire-bonding process of the first and second wires W1 and W2. For example, when based on the structure of the photosensor-amplifier device of the first embodiment, the photosensor-amplifier device of this embodiment is built in the following manner.

As shown in FIG. 3, on a printed circuit board 60, a photodiode chip 1 functioning as a photoelectric conversion element and an IC chip 2 incorporating an amplifier circuit and other components are mounted. On the printed circuit board 60, conducting patterns P1 and P2 are also formed. Here, the photodiode chip 1 and the IC chip 2 are mounted on conducting patterns P3 and P4, respectively.

The anode electrode 14 of the photodiode chip 1 and a first electrode 21 of the IC chip 2 are electrically connected by way of separate first wires W11 and W12, respectively, to the conducting pattern P1 that is common to those electrodes. Similarly, the dummy electrode 16 of the photodiode chip 1 and a second electrode 22 of the IC chip 2 are electrically connected by way of separate second wires W21 and W22, respectively, to the conducting pattern P2 that is common to those electrodes.

In the wire-bonding process of the first wire W11, first, one end of the first wire W11 is bonded to the anode electrode 14 of the photodiode chip 1 (the first bonding), and then the other end of the first wire W11 is bonded to the conducting pattern P1 (the second bonding). In the wire-bonding process of the first wire W12, first, one end of the first wire W12 is bonded to the first electrode 21 of the IC chip 2, and then the other end of the first wire W12 is bonded to the conducting pattern P1.

Similarly, in the wire-bonding process of the second wire W21, first, one end of the second wire W21 is bonded to the dummy electrode 16 of the photodiode chip 1, and then the other end of the second wire W21 is bonded to the conducting pattern P2. In the wire-bonding process of the second wire W22, first, one end of the second wire W22 is bonded to the second electrode 22 of the IC chip 2, and then the other end of the second wire W22 is bonded to the conducting pattern P2.

Providing common conducting patterns P1 and P2 in this way eliminates the need to perform the second bonding, which is prone to cause chip breakage, on the photodiode chip 1 nor on the IC chip 2 in the wire-bonding processes of the first wires W11 and W12 and of the second wires W21 and W22. Thus, it is possible to reduce the risk of chip breakage in a wire-bonding process.

A photosensor-amplifier device embodying the present invention can be used, for example, in a receiver device in an infrared communication apparatus. This makes highly accurate reception of infrared signals possible, and thereby helps realize an infrared receiver device that is less prone than ever to malfunctioning.

What is claimed is:

1. A photosensor-amplifier device comprising:
   a photoelectric conversion element that converts an optical signal into an electric signal;
   a first electrode connected electrically to the photoelectric conversion element and by which the electric signal is extracted from the photoelectric conversion element;
   a second electrode formed on the photoelectric conversion element in close proximity to the first electrode in such a way that the electric signal does not pass through the second electrode;
   an amplifier circuit that has a first input terminal and a second input terminal and that amplifies and then outputs a difference between electric signals fed to the first and second input terminals;
   a first bonding wire that connects the first electrode to the first input terminal; and
   a second bonding wire having substantially an identical length as the first bonding wire and laid side-by-side substantially parallel to the first bonding wire, the second bonding wire that connects the second electrode to the second input terminal.

wherein each of the first electrode, the second electrode, the first input terminal, and the second input terminal are arranged in a substantially rectangular shape in plan view such that the first and second bonding wires receive electromagnetic noise in substantially equal degrees so that noise signals induced in the first and second bonding wires are made substantially equal to each other, the photosensor-amplifier device further comprising:
a substrate on which a first element formed as the photoelectric conversion element and a second element formed as the amplifier circuit are mounted; and
a first conductor pattern and a second conductor pattern formed on the substrate,
wherein the first bonding wire comprises a first portion and a second portion,
the first portion of the first bonding wire connects the first electrode to the first conductor pattern, and the second portion of the first bonding wire connects the first conductor pattern to the first input terminal,
the second bonding wire comprises a first portion and a second portion,
the first portion of the second bonding wire connects the second electrode to the second conductor pattern, and the second portion of the second bonding wire connects the second conductor pattern to the second input terminal.

2. A photosensor-amplifier device as claimed in claim 1, wherein, when the first and second bonding wires are bonded, a first-bonding operation is performed on the first and second elements and a second-bonding operation is performed on the first and second conductor patterns, respectively.

3. A photosensor-amplifier device comprising:
a first chip having a photoelectric conversion element that converts an optical signal into an electric signal;
a first electrode formed on the first chip and connected electrically to the photoelectric conversion element;
a second electrode formed on the first chip so as to be located in close proximity to the first electrode;
a second chip having an amplifier circuit for amplifying and outputting a difference between electric signals fed thereto;
a first input terminal formed on the second chip and connected electrically to one input portion of the amplifier circuit;
a second input terminal formed on the second chip so as to be located in close proximity to the first input terminal and connected electrically to another input portion of the amplifier circuit;
a first bonding wire connecting the first electrode to the first input terminal; and
a second bonding wire having substantially an identical length as the first bonding wire and laid substantially parallel thereto, the second bonding wire connecting the second electrode to the second input terminal,
wherein identical bias voltages are applied to the first and second input terminals,
wherein each of the first electrode, the second electrode, the first input terminal, and the second input terminal are arranged in a substantially rectangular shape in plan view such that the first and second bonding wires receive electromagnetic noise in substantially equal degrees so that noise signals induced in the first and second bonding wires are made substantially equal to each other, wherein the photoelectric conversion element is a photodiode formed, on a semiconductor substrate of one conductivity type, by joining a semiconductor of another conductivity type and coating a top surface with an insulating film;
the first electrode is formed by removing a part of the insulating film so that the first electrode is made contact with the semiconductor of another conductivity type; and
the second electrode is formed on the insulating film and is electrically open.

4. A photosensor-amplifier device comprising:
a first chip having a photoelectric conversion element that converts an optical signal into an electric signal;
a first electrode formed on the first chip and connected electrically to the photoelectric conversion element;
a second electrode formed on the first chip so as to be located in close proximity to the first electrode;
a second chip having an amplifier circuit for amplifying and outputting a difference between electric signals fed thereto;
a first input terminal formed on the second chip and connected electrically to one input portion of the amplifier circuit;
a second input terminal formed on the second chip so as to be located in close proximity to the first input terminal and connected electrically to another input portion of the amplifier circuit;
a first bonding wire connecting the first electrode to the first input terminal; and
a second bonding wire having substantially an identical length as the first bonding wire and laid substantially parallel thereto, the second bonding wire connecting the second electrode to the second input terminal,
wherein identical bias voltages are applied to the first and second input terminals,
wherein each of the first electrode, the second electrode, the first input terminal, and the second input terminal are arranged in a substantially rectangular shape in plan view such that the first and second bonding wires receive electromagnetic noise in substantially equal degrees so that noise signals induced in the first and second bonding wires are made substantially equal to each other,
wherein the first chip includes a first region formed, in a top portion of a semiconductor substrate of one conductivity type, by joining a semiconductor of another conductivity type; a second region, sufficiently smaller than the first region, formed in the top portion of the identical semiconductor substrate by joining the semiconductor of another conductivity type; and an insulating film coating a top surface of the first chip,
a photodiode is formed by removing a part of the insulating film that coats the first region and by forming the first electrode so as to be made contact with the first region,
a dummy photodiode shielded from light is formed by removing a part of the insulating film that coats the second region and by forming the second electrode in such a way that the second electrode is made contact with the second region through the removed part of the insulating film and that the second electrode covers all of a top portion of the second region.

5. A photosensor-amplifier device comprising:

a first chip having a photoelectric conversion element that converts an optical signal into an electric signal;

a first electrode formed on the first chip and connected electrically to the photoelectric conversion element;

a second electrode formed on the first chip so as to be located in close proximity to the first electrode;

a second chip having an amplifier circuit for amplifying and outputting a difference between electric signals fed thereto;

a first input terminal formed on the second chip and connected electrically to one input portion of the amplifier circuit;

a second input terminal formed on the second chip so as to be located in close proximity to the first input terminal and connected electrically to another input portion of the amplifier circuit;

a first bonding wire connecting the first electrode to the first input terminal; and a second bonding wire having substantially an identical length as the first bonding wire and laid substantially parallel thereto, the second bonding wire connecting the second electrode to the second input terminal, wherein identical bias voltages are applied to the first and second input terminals, wherein each of the first electrode, the second electrode, the first input terminal, and the second input terminal are arranged in a substantially rectangular shape in plan view such that the first and second bonding wires receive electromagnetic noise in substantially equal degrees so that noise signals induced in the first and second bonding wires are made substantially equal to each other, the photosensor-amplifier device further comprising:

a substrate, having a first conductor pattern and a second conductor pattern formed thereon, for mounting the first chip and the second chip thereon, wherein the first bonding wire comprises a first portion and a second portion, the first portion of the first bonding wire connects the first electrode to the first conductor pattern, and the second portion of the first bonding wire connects the first conductor pattern to the first input terminal, the second bonding wire comprises a first portion and a second portion, the first portion of the second bonding wire connects the second electrode to the second conductor pattern, and the second portion of the second bonding wire connects the second conductor pattern to the second input terminal.

6. A photosensor-amplifer device as claimed in claim 5, wherein, when the first and second bonding wires are bonded, a first-bonding operation is performed on the first and second chips and a second-bonding operation is performed on the first and second conductor patterns respectively.

* * * * *